United States Patent
Yehezkely

(10) Patent No.: US 9,431,992 B2
(45) Date of Patent: Aug. 30, 2016

(54) METHOD FOR DESIGNING COUPLING-FUNCTION BASED MILLIMETER WAVE ELECTRICAL ELEMENTS

(71) Applicant: QUALCOMM Incorporated, San Diego, CA (US)

(72) Inventor: Alon Yehezkely, Tel-Aviv (IL)

(73) Assignee: Qualcomm Incorporated, San Diego, CA (US)

(\*) Notice: Subject to any disclaimer, the term of this patent is extended or adjusted under 35 U.S.C. 154(b) by 0 days.

(21) Appl. No.: 14/286,566

(22) Filed: May 23, 2014

(65) Prior Publication Data

US 2014/0306779 A1  Oct. 16, 2014

Related U.S. Application Data

(62) Division of application No. 12/882,403, filed on Sep. 15, 2010, now Pat. No. 8,760,240.

(51) Int. Cl.
| | |
|---|---|
| *H03H 7/48* | (2006.01) |
| *H03H 7/21* | (2006.01) |
| *H01F 5/00* | (2006.01) |
| *H01P 5/18* | (2006.01) |
| *H04B 1/58* | (2006.01) |
| *H03H 1/00* | (2006.01) |

(52) U.S. Cl.
CPC ............... *H03H 7/48* (2013.01); *H01F 5/003* (2013.01); *H01P 5/184* (2013.01); *H03H 7/21* (2013.01); *H04B 1/581* (2013.01); *H03H 2001/0085* (2013.01)

(58) Field of Classification Search
CPC . H03F 2027/2809; H03F 5/003; H03H 7/48; H03H 7/21; H03H 2001/0085; H03H 7/09; H04B 1/581
USPC .................. 333/119, 177, 185, 140; 336/200; 29/602.1
See application file for complete search history.

(56) References Cited

U.S. PATENT DOCUMENTS

| | | | |
|---|---|---|---|
| 5,313,175 A | 5/1994 | Bahl et al. | |
| 6,346,863 B2 | 2/2002 | Sasaki et al. | |
| 6,501,363 B1 * | 12/2002 | Hwu et al. | ..................... 336/200 |
| 6,577,219 B2 | 6/2003 | Visser | |
| 7,403,090 B2 | 7/2008 | Kita | |

(Continued)

OTHER PUBLICATIONS

"Effect of a ground shield of a silicon on-chip spiral inductor"; Murata et al.; Microwave Conference, Dec. 2000; IEEE.*

(Continued)

*Primary Examiner* — Robert Pascal
*Assistant Examiner* — Rakesh Patel

(57) ABSTRACT

A method for designing a coupling-function based millimeter wave electrical element. The method comprises computing a length of a first metal line and a second metal line; computing a first number of turns for the first metal line and a second number of turns for the second metal line; determining a width value of each of the first metal line and the second metal line; determining a spacing value between the first metal line and the second metal line; winding the first metal line on a first metal layer according to the first number of turns and winding the second metal line on the first metal layer and, in part, on a second metal layer according to the second number of turns, thereby resulting in a spiraled structure; and setting ports for the spiraled structure to form a complete design of the millimeter wave electrical element.

17 Claims, 6 Drawing Sheets

(56) References Cited

U.S. PATENT DOCUMENTS

| | | |
|---|---|---|
| 7,456,721 B2 | 11/2008 | Chiu |
| 8,760,240 B2 | 6/2014 | Yehezkely |
| 2002/0149440 A1 | 10/2002 | Deckman |
| 2006/0006962 A1 | 1/2006 | Du Toit et al. |
| 2009/0212872 A1 | 8/2009 | Chang et al. |
| 2009/0284339 A1* | 11/2009 | Choi .................. H01F 17/0013 336/200 |
| 2010/0171567 A1 | 7/2010 | Krishnaswamy et al. |
| 2011/0032065 A1* | 2/2011 | Raczkowski ................. 336/200 |

OTHER PUBLICATIONS

C.Z. Chen, Y.0S. Lin, C.-C. Chen, P.-F. Yeh, and J.-F Change, "High-Coupling and Ultra-Low-Loss Interlaced Stacked Transformers for 60-100 GHz CMOS RFIC Applications", IEEE Radio and Wireless Symposium, 2007, pp. 357-360.

Gary Breed, "High Frequency Design Quadrature Couplers: Transmission Line and Lumped Element Quadrature Couplers"; High Frequency Electronics; pp. 44, 46, 48; Nov. 2009.

H.-Y Chang, P.-S Wu, T.-W Huang, H. Wang, Y.-C Tsai, and C.-H Chen, "An Ultra Compact and Broadband 15-75 GHz BPSK Modulator using 0.13-micron CMOS Process", IEEE MTT-S, Jun. 2005, pp. 41-44.

K. Shibata, K. Hatori, Y. Tokumitsu, and Hidemitsu, "Microstrip Spiral Directional Coupler", IEEE Trans. on Microwave Theory and Techniques, vol. MTT-29, No. 7, Jul. 1981, pp. 680-689.

P.S. Wu, C.-H. Wang, T.-W. Huang, and H. Wang, "Compact and Broad-Band Millimeter-Wave Monolithic Transformer Balanced Mixers", IEEE Trans. on Microwave Theory and Techniques, vol. 33, No. 10, Oct. 2005, pp. 3106-3114.

STMicroelectronics, "Deep Sub-Micron Processes: 120nm, 90nm, 65 nm CMOS", CMP annual users meeting; Jan. 18, 2007, Paris, France.

T.O. Dickson, M.-A. LaCroix, S. Boret, D. Gloria, R. Beerkens, S. Voingescu, "30-100-GHz Inductors and Transformers for Millimeter-Wave (Bi)CMOS Integrated Circuits", vol. 53, No. 1, Jan. 2005, pp. 123-133.

T. Senju, T. Asano, H. Ishimura, "A Very Small 3.5 GHz 1-W MMIC Power Amplifier with Die Size Reduction Technologies", 2001 IEEE Emerging Technologies Symposium on Broadband Communications for the Internet Era, 2001, pp. 70-73.

* cited by examiner

METHOD FOR DESIGNING COUPLING-FUNCTION BASED MILLIMETER WAVE ELECTRICAL ELEMENTS

CROSS REFERENCE TO RELATED APPLICATION

This application is a divisional of U.S. patent application Ser. No. 12/882,403, filed on Sep. 15, 2010, now allowed, the contents of which are hereby incorporated by reference for all that they contain.

TECHNICAL FIELD

The present invention relates generally to millimeter wave electronics, and more particularly to millimeter wave electrical elements implementing a coupling function.

BACKGROUND

The 60 GHz band is an unlicensed band that features a large amount of bandwidth which means that a very high volume of information can be transmitted wirelessly. As a result, multiple applications that require transmission of a large amount of data can be developed to allow wireless communication around the 60 GHz band. Examples for such applications include, but are not limited to, wireless high definition TV (HDTV), wireless docking station, wireless Gigabit Ethernet, and many others. The objective of the industry is to integrate 60 GHz band applications with portable devices including, but not limited to, netbook computers, tablet computers, smartphones, laptop computers, and the like. The physical size of such devices is relatively small, thus the area for installing additional circuitry to support 60 GHz applications is limited.

Recently developed techniques allow fabricating integrated circuits (ICs) that operate in millimeter wave frequencies. An example for one such technique is the monolithic microwave integrated circuit (MMIC) or radio frequency IC (RFIC). The dimensions of RFICs are relatively small, ranging from around 1 square-millimeter ($mm^2$) to 10 $mm^2$ and such RFICs can be mass-produced.

However, even when designing a RF circuit as an IC, there still is a need to integrate many electronic elements in the same IC while keeping the size of the fabricated chip as small as possible and while not degrading performance of the IC. In addition, there is a need to fabricate such a design with minimum design constraints.

Phase shifters and hybrids are examples for electronic elements that implement a coupling function. Such elements are designed to achieve a specific phase difference and impedance matching between ports. A hybrid is a form of a reciprocal four-port device that provides a phase difference of 90-degrees or 180-degrees between two designated ports. A phase shifter can be implemented based on the hybrid to provide a controllable phase change of a RF signal as part of a phase array antenna.

One technique for designing of a hybrid element is based on a coupled transmission lines structure 100 as illustrated in FIG. 1. The length of the transmission lines 110 is typically $\lambda/4$. However, when fabricating the lines on a multilayer semiconductor substrate the length of each line is shortened due to the characteristics of the substrate, but still the length of each metal line 110 is not less than 0.6 mm (600 micron, instead of 1.25 mm). Mutual coupling is achieved when the metal lines 110 are perfectly adjacent to each other. The coupling may be degraded, hence the efficiency of the structure 100 due to increased line spacing, line impedance differences, and/or line lengths less than $\lambda/4$ is also degraded. Other conventional techniques for designing a hybrid are the branch-line coupler and the rat-race Hybrid, which typically include 4 transmission lines.

The coupled transmission lines structure 110 may be implemented in a form of a lumped element to achieve good coupling. A diagram illustrating such an implementation is shown in FIG. 2. In the lumped element 200, transmission lines are implemented as a LC (pi) network that includes inductors 210 and capacitors 220. The inductors 210 are wound on the substrate. However, such implementation requires specific inductors and capacitors, thus resulting in a larger area and more gain losses in comparison to the structure 100.

Thus, one of the drawbacks of the conventional coupled transmission lines structure and an equivalent lumped element is that they are considerably large in size for IC designs. Therefore, such structures are unsuitable for use in RFICs' designs, hence such structures are not partial in millimeter wave electrical elements, and more particularly elements that should be integrated in devices for 60 GHz applications.

Therefore, it would be advantageous to provide a solution for designing compact size millimeter wave electrical elements that are based on a coupling function.

SUMMARY

Certain embodiments include a method for designing a coupling-function based millimeter wave electrical elements. The method comprises computing a length of a first metal line and a second metal line; computing a first number of turns for the first metal line and a second number of turns for the second metal line, wherein the length and number of turns of each of the first metal line and the second metal line are computed to meet radio-frequency (RF) properties of a millimeter wave electrical element to be designed; determining a width value of each of the first metal line and the second metal line; determining a spacing value between the first metal line and the second metal line; winding the first metal line on a first metal layer according to the first number of turns and winding the second metal line on the first metal layer and, in part, on a second metal layer according to the second number of turn, thereby resulting in a spiraled structure; and setting ports for the spiraled structure to form a complete design of the millimeter wave electrical element.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION

Figure 1:
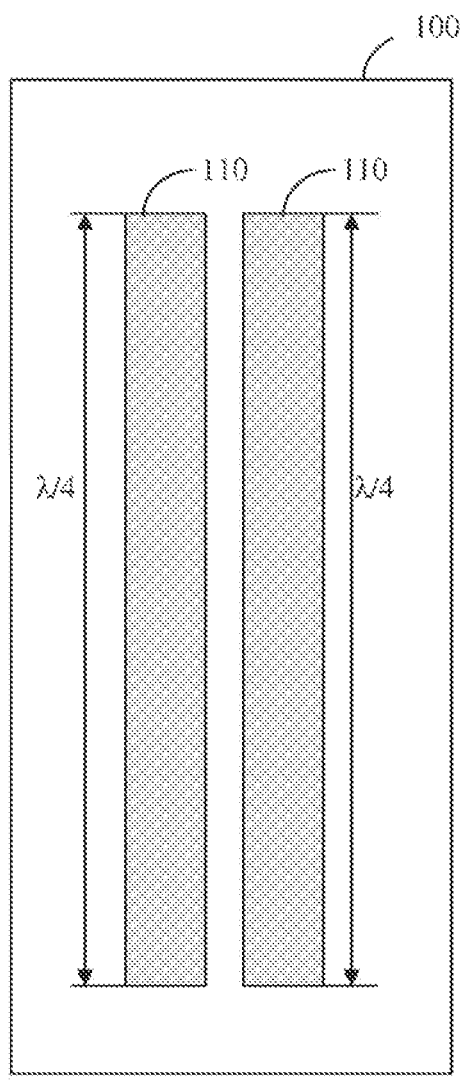
FIG. 1 is a schematic diagram of a prior art coupled transmission lines structure.
Figure 2:
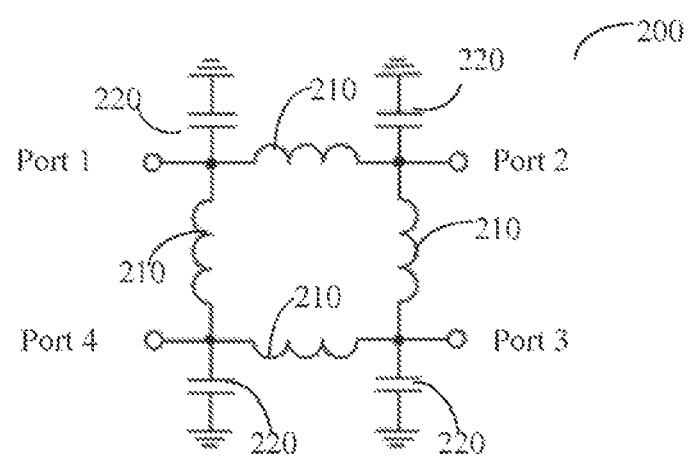
FIG. 2 is a schematic diagram of a prior art lumped element coupled-lines hybrid.

The embodiments disclosed herein are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Certain exemplary embodiments provide a method for implementing a coupling function when designing millimeter wave electric elements. Using the method of certain embodiments, efficient hybrids and phase shifters for millimeter wave frequencies can be designed. In accordance with certain embodiments, a good coupling function characterized by strong self-inductance and capacitance is achieved by tightly winding two metal lines, such as bifilar lines on the same layer of a multilayer substrate.

Figure 3:
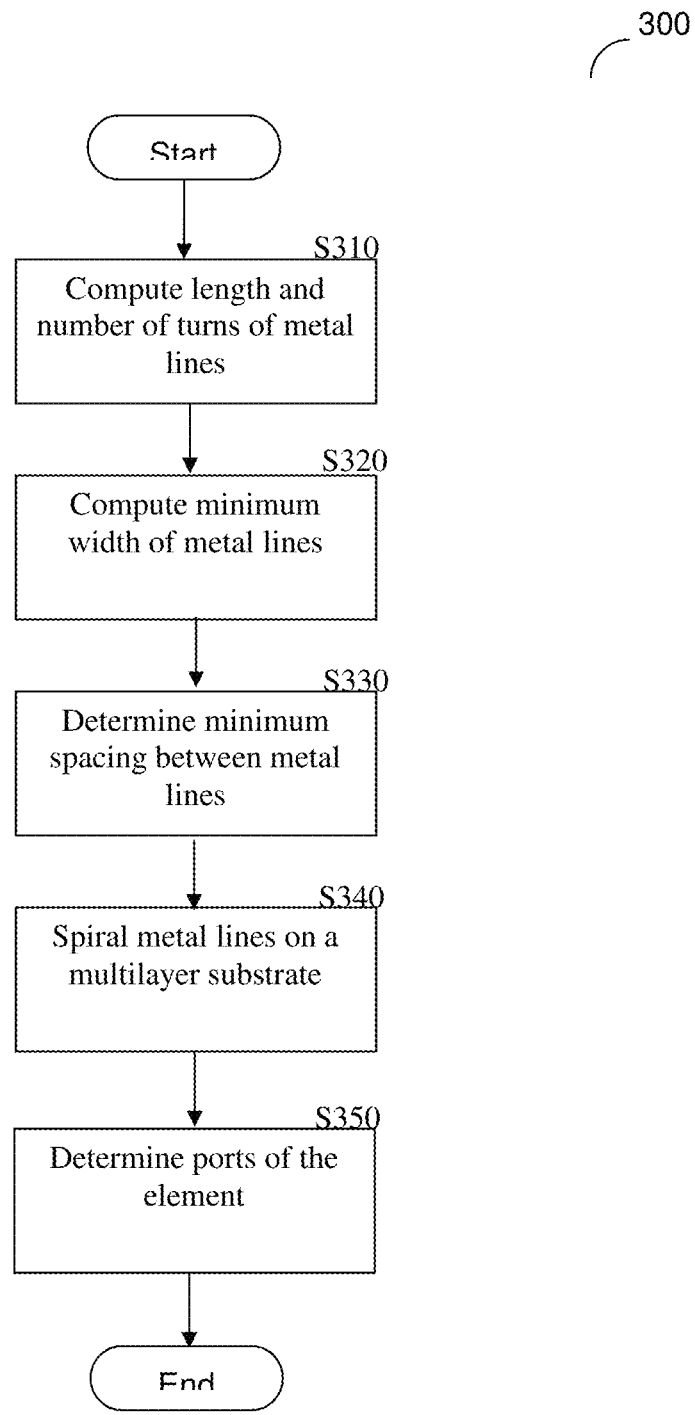
FIG. 3 is a flowchart illustrating a method for designing a coupling function based millimeter wave electrical elements in accordance with an embodiment.

FIG. 3 shows a non-limiting and exemplary flowchart 300 illustrating a method for designing coupling function based millimeter wave electrical elements in accordance with an embodiment. Two metal lines are required to design a coupling function based millimeter wave electrical element. At S310, the length and a number of turns of each of the metal lines are computed. In accordance with some embodiments, a "turn" shall have the meaning of a curve on a plane that winds around a fixed center point in the designed element and creates a complete loop (not a closed loop). The effect of the turns is of a wound structure printed on a plane of a multilayer semiconductor substrate. The number of turns and length of the metal lines computed to meet RF properties of the element to be designed. The RF properties include, but are not limited to, operation frequency, phase difference, bandwidth, and impedance matching of the element's ports. For example, increasing the number of turns improves the lumped effect of the designed structure, thereby reducing the losses of the element and the overall size. As another example, the length of the metal lines may determine the operating frequency of the designed electrical element (longer lines lead to lower frequency and vice versa). For example, when designing a 90-degree hybrid, the resulting structure resonates between windings of the two metal lines. The resonance frequency is such that the power transferred from an Input port to a Through port of the hybrid is equal to the power delivered from an Input port to a Coupled port of the hybrid. The resonance frequency determines the total line length given the possible number of turns. Higher frequencies require shorter metal lines, and given the size limitation of the hybrid, it leads to less turns. Further, the winding should be performed without closing the "hole" in the spiral structure which is required for magnetic coupling to happen. Therefore, in accordance with an embodiment, the length and number of turns are determined based on the magnitude of the power transfer from the Input port to the Through port and from the Input port to the Coupled port of the design, wherein the crossing point of these power transfers states the resonating frequency. That is, the Input-Through ports transfer declines, while the Input-Coupled power transfer inclines. The crossing point of the power transfers can be changed by adjusting the number of turns to meet a specific frequency.

At S320, the minimum width of each of the metal line is determined. In an embodiment, this determination is based on the process utilized for fabricating the designed element. Preferably, the width of a metal line should be approximately close to the minimum width allowed by the fabrication process. For example, a deviation of up to 5% from the minimum width for a metal line, as defined by the process, may be allowed. In an exemplary embodiment, the minimum width of a metal line is less than 3 microns.

At S330, the minimum spacing allowed between two metal lines is determined. In an embodiment, this determination is based on the fabrication process. Preferably, the spacing value is selected to be approximately close to the minimum spacing between two metal lines as allowed by the fabrication process. For example, a deviation of up to 5% from the minimum spacing value is allowed. In an exemplary embodiment, the spacing between the two metal lines is 0.5 micron.

To maximize the mutual inductance and capacitance between the metal lines, a fabrication process that can ensure minimum spacing and width values is selected. In accordance with an exemplary embodiment, a 7-copper metal layers deep sub-micron used for 65 nanometer (nm) CMOS fabrication process is utilized. Such a process provides the capability of fine metal spacing and width such that strong electromagnetic fields can be achieved for compact structures with tight windings. Further, providing compact structures using a CMOS process causes to relaxation in metal density constraints.

At S340, the two metal lines each having a length as computed at S310 and a width as determined at S320 are wound on one layer of the multilayer semiconductor substrate. The metal lines are adjacent to each other at a minimum spacing distance. The number of turns of the two metal lines should be performed as computed at S310. Various embodiments for different setting of the length and number of turns for constructing electrical elements are provided below.

It should be noted that winding the metal lines does not require following any symmetry requirements and port locus, thus flexibility when designing millimeter wave electrical elements based on a coupling function is allowed. At S350, ports of the resulting spiraled structure are defined by specifying the connectivity of each end of each metal line. Various examples for defining the ports are provided below.

It should be appreciated that by using minimum line spacing and minimum width, a relatively high number of windings can be achieved. This results in a compact structure characterized by strong mutual inductance and capacitance which is relatively insensitive to port locus. Further, tightly winding the two metal lines results in strong coupling properties as provided by a lumped element without using specific inductors and capacitors in the design. In addition, as will be demonstrated below, millimeter wave electrical elements designed using the disclosed method includes a small number of crosses between the metal lines and low return path losses.

The above embodiments may be implemented in any computer aided design (CAD) tools utilized in the design of RFICs.

Figure 4:
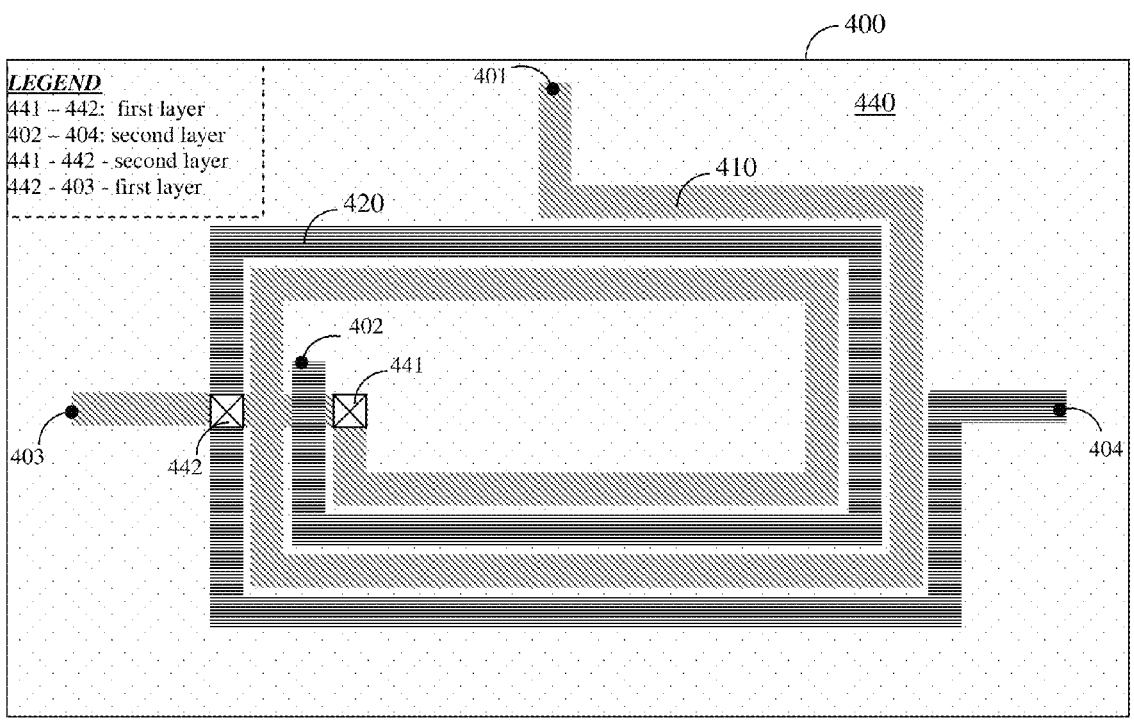
FIG. 4 is a schematic diagram of a 90-degree hybrid in accordance with an embodiment.

FIG. 4 shows an exemplary diagram of a hybrid design 400 according to an embodiment. The hybrid 400 is designed to operate in millimeter wave frequencies such as, e.g., a frequency band of 60 GHz. The hybrid design 400 is constructed using metal lines 410 and 420. The width of each of the metal lines 410 and 420 and the spacing between them is set to the minimum values allowed by the fabrication process, e.g., a copper metal layers deep sub-micron used in a 65 nanometer CMOS process.

The length and number of turns of the metal lines 410 and 420 determine spiraling of the metal lines, thereby affecting the mutual capacitance and inductance, capacitance to ground, and self-inductance of the hybrid 400. It should be noted that only for the sake of clarity, without limiting the scope of the invention, the metal lines 410 and 420 are illustrated differently. However, this does not imply that the lines 410 and 420 behave differently.

In the hybrid design 400, there are 4 ports 401, 402, 403 and 404 defined as Input, Isolated, Through, and Coupled ports respectively. The metal line 410 connects port 401 to port 403 and curves for 1.75 turns. The port 402 is connected via 1.5 turns in the metal line 420 to the port 404. The port 402 is further connected to a termination, e.g., a 50 Ohm resistor. The metal line 420 is fabricated on the same metal layer (e.g., layer 7) of a multilayer substrate 440 as the metal line 410, except for the section between vias 441 and 442. In this section, the metal layer 420 underpasses to a lower metal layer (e.g., layer 6). In accordance with an exemplary embodiment, the metal lines' 410 and 420 lengths, widths and spacing are 275 micron, 3 micron, and 0.5 micron respectively.

The coupling effects of the hybrid 400 are spread over the design in an uneven manner. Specifically, the bottom part of the design features mutual capacitance and inductance between 4 parallel metal lines (portions of lines 410 and 420). On the other hand, the upper left portion of the design provides coupling between two metal lines. Therefore, the hybrid design 400 is effectively equivalent to a lumped element implemented as an LC (pi) network. It should be noted that the inductances and capacitances distribution is a function of the port locations and the overall dimensions of the structure.

As the hybrid design 400 is a pi-network equivalent, a connection from port 401 to port 403 functions as a high-pass filter, while the connection from a port 401 to a port 404 behaves as a low-pass filter. Port 402 is terminated. In a non-limiting embodiment, transfer functions of the filters perform a 45-degree phase lead between ports 401 and 404 and a 45-degree phase lag from between ports 401 and 403. Thus, the total phase difference of between output signals at ports 403 and 404 relatively to port 401 is 90-degree.

Figure 5:
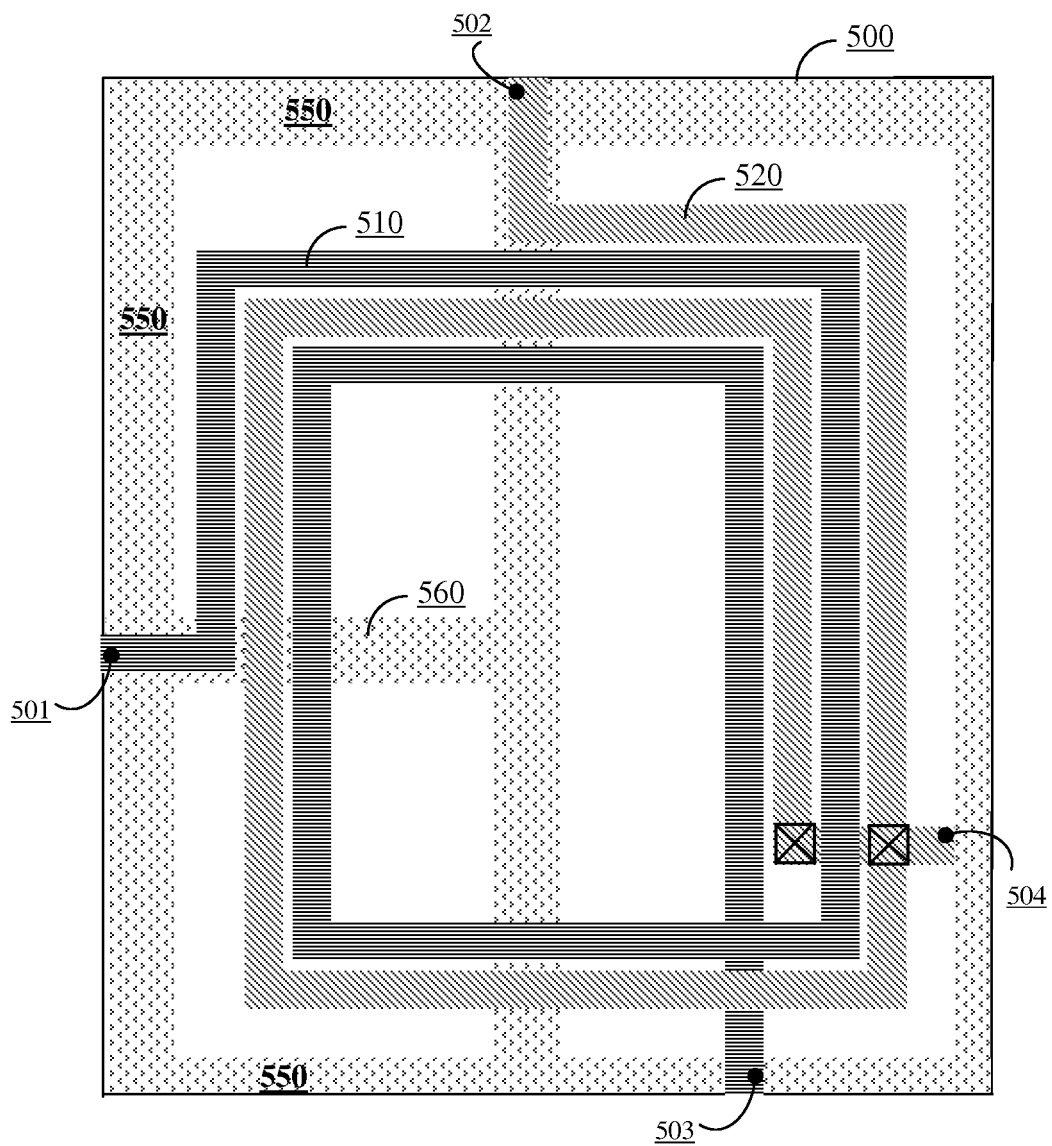
FIG. 5 is a schematic diagram of a 90-degree hybrid in accordance with another embodiment.

FIG. 5 shows a schematic diagram of a hybrid design 500 constructed in accordance with another embodiment. The hybrid design 500 features different port locations in comparison to the hybrid design 400. As a result, the inductances and capacitances are distributed differently in this embodiment. The hybrid design 500 is a 90-degree hybrid that can be utilized, for example, in a phase shifter antenna. Thus, there is a phase difference between the output signals at ports 503 (Through) and 504 (Coupled) relatively to an input signal at port 501 (Input). The ports 501 and 503 are connected through a metal line 510 and the ports 502 and 504 are connected via a metal line 520. The port 502 (Isolated) is terminated.

In accordance with the embodiment illustrated in FIG. 5, in order to suppress the effect of return-path flows through a perimeter ground 550, the hybrid is fabricated over parts 560 of the ground. The ground is typically the first metal layer of the multilayer substrate. Typically, the signal at each port is identified as being measured and driven between the metal lines and the ground metal. Ideally, the ground is a single node which implies that physical locations of all the ports reference metals are actually shorted to each other. Practically, electric voltage is built between these nodes, as the ports are not ideally shorted. Hence, it is important to model the return-path. Further, the return-path should be designed in a way that it does not degrade performance and limits port locus in order to maintain design flexibility. This is typically the case when the return-path flows through the perimeter ground 550. In accordance with an embodiment, the hybrid design 500 is structured to limit the effect of the return-path flowing through a perimeter ground 550 by shorting perimeter ground 550 using the part of metal 560. In an exemplary embodiment, the length of metal lines 510 and 520 is 275 microns and the number of turns of metal line 510 is 1.75, while the number of turns of the metal line 520 is 1.5.

As mentioned above, the length and number of turns determine the operation frequency of the electrical element. For example, a 90-degree hybrid operation in a 30 GHz can be designed using the same layout as the hybrid 500 by lengthening the metal wires. In an exemplary embodiment, a 30 GHz hybrid is designed with metal lines having length of 560 micron and 490 micron and 1.75 and 1.5 turns respectively.

Figure 6:
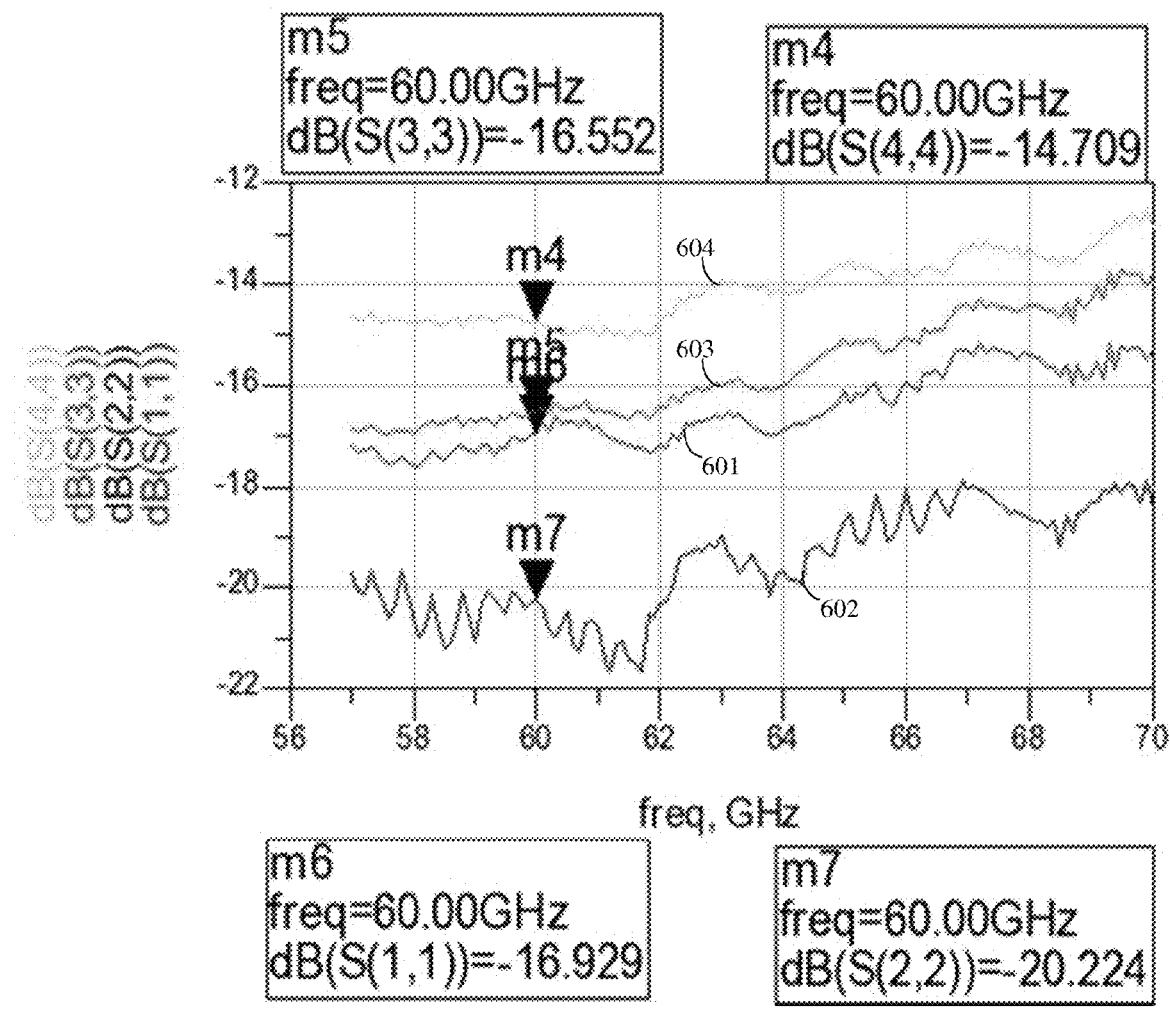
FIG. 6 depicts graphs illustrating return loss varying with frequency measured for a 90-degree hybrid designed in accordance with an embodiment.

FIG. 6 depicts graphs of return-loss varying with frequency results measured for a 90-degree hybrid operating in a 60 GHz frequency band and constructed in accordance with an embodiment. The return-loss is a measure of voltage standing wave ratio (VSWR), expressed in decibels (db) and may be caused due to an impedance mismatch. A high value of return-loss denotes better quality of the electrical element under test. The graphs 601, 602, 603, and 604 depict the return-loss at ports 401, 402, 403, and 404 of the hybrid 400, respectively. During the test, each port is terminated to a 50 Ohm termination. As can be noticed for frequency band from 56 GHz to 70 GHz frequency, each measured return-loss is below −12 db. A person with ordinary skill the art should appreciate that such a result represents a low return-loss value and, thus, good performance of the hybrid.

It is important to note that these embodiments are only examples of the many advantageous uses of the innovative teachings herein. Specifically, the innovative teachings disclosed herein can be adapted in any type of consumer electronic devices where reception and transmission of millimeter wave signals is needed.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for fabricating an apparatus, comprising:
   winding a first strip of conductive material on a first layer of a multi-layer substrate of the apparatus according to a first number of turns to form a first inductor;
   winding a second strip of conductive material on the first layer of the multi-layer substrate and, in part, on a second layer of the multi-layer substrate according to a second number of turns to form a second inductor, wherein the first strip of conductive material and the second strip of conductive material are wound to form a spiraled structure such that the second strip of conductive material is magnetically coupled with the first strip of conductive material;

forming a third strip of conductive material around the first inductor and the second inductor on a third layer of the multi-layer substrate as viewed from a perspective perpendicular to the third layer, wherein a first part of the third strip of conductive material is shorted to a second part of the third strip of conductive material via a fourth strip of conductive material, wherein the first inductor and the second inductor overlap the fourth strip of conductive material as viewed from a perspective perpendicular to the third layer, and wherein the third strip of conductive material is used to provide a reference potential for a circuit comprising the first inductor and the second inductor; and setting ports for the spiraled structure.

2. The method of claim 1, wherein the apparatus is configured as a hybrid element or a phase shifter.

3. The method of claim 2, wherein:
the hybrid element is a 90-degree hybrid element or a 180-degree hybrid element; and
the phase-shifter is a 90-degree phase-shifter or a 180-degree phase-shifter.

4. The method of claim 1, wherein the first layer is a most upper layer of the multilayer substrate.

5. The method of claim 1, wherein the second layer is on a layer that is adjacent to the first layer.

6. The method of claim 5, wherein the second strip of conductive material crosses the first strip of conductive material on the second layer of the multi-layer substrate.

7. The method of claim 1, wherein the spiraled structure is characterized by mutual inductance and mutual capacitance of the first and second strips of conductive material.

8. A portable device, comprising:
an integrated circuit (IC) comprising a multi-layer substrate, wherein the IC further comprises:
a first strip of conductive material wound on a first layer of the multi-layer substrate according to a first number of turns to form a first inductor;
a second strip of conductive material wound on the first layer of the multi-layer substrate and, in part, on a second layer of the multi-layer substrate according to a second number of turns to form a second inductor, wherein the first strip of conductive material and the second strip of conductive material are wound to form a spiraled structure such that the second strip of conductive material is magnetically coupled with the first strip of conductive material;
a third strip of conductive material formed around the first inductor and the second inductor on a third layer of the multi-layer substrate as viewed from a perspective perpendicular to the third layer, wherein a first part of the third strip of conductive material is shorted to a second part of the third strip of conductive material via a fourth strip of conductive material, wherein the first inductor and the second inductor are formed over the fourth strip of conductive material as viewed from the perspective perpendicular to the third layer, and wherein the third strip of conductive material is used to provide a reference potential for a circuit comprising the first inductor and the second inductor; and
a plurality of ports for the spiraled structure.

9. The portable device of claim 8, wherein the portable device is configured as a hybrid element or a phase-shifter.

10. The portable device of claim 9, wherein:
the hybrid element is a 90-degree hybrid or a 180-degree hybrid element; and
the phase-shifter is a 90-degree phase-shifter or a 180-degree phase-shifter.

11. An apparatus, comprising:
a multi-layer substrate;
a first strip of conductive material wound on a first layer of the multi-layer substrate according to a first number of turns to form a first inductor;
a second strip of conductive material wound on the first layer of the multi-layer substrate and, in part, on a second layer of the multi-layer substrate according to a second number of turns to form a second inductor, wherein the first strip of conductive material and the second strip of conductive material are wound to form a spiraled structure such that the second strip of conductive material is magnetically coupled with the first strip of conductive material;
a third strip of conductive material formed around the first inductor and the second inductor on a third layer of the multi-layer substrate as viewed from a perspective perpendicular to the third layer, wherein a first part of the third strip of conductive material is shorted to a second part of the third strip of conductive material via a fourth strip of conductive material, wherein the first inductor and the second inductor overlap the fourth strip of conductive material as viewed from the perspective perpendicular to the third layer, and wherein the third strip of conductive material is used to provide a reference potential for a circuit comprising the first inductor and the second inductor; and
a plurality of ports for the spiraled structure.

12. The apparatus of claim 11, wherein the first layer is a most upper layer of the multilayer substrate.

13. The apparatus of claim 11, wherein the apparatus is configured as a hybrid element or a phase-shifter.

14. The apparatus of claim 13, wherein:
the hybrid element is a 90-degree hybrid element or a 180-degree hybrid element; and
the phase-shifter is a 90-degree phase-shifter or a 180-degree phase-shifter.

15. The apparatus of claim 11, wherein the spiraled structure is characterized by mutual inductance and mutual capacitance of the first and second strips of conductive material.

16. The apparatus of claim 11, wherein the second layer is on a layer that is adjacent to the first layer.

17. The apparatus of claim 11, wherein the second strip of conductive material crosses the first strip of conductive material on the second layer of the multi-layer substrate.

* * * * *